United States Patent
Hanrath et al.

(10) Patent No.: US 7,858,181 B2
(45) Date of Patent: Dec. 28, 2010

(54) GROWTH OF SINGLE CRYSTAL NANOWIRES

(75) Inventors: Tobias Hanrath, Austin, TX (US); Xianmao Lu, Austin, TX (US); Keith Johnston, Austin, TX (US); Brian Korgel, Austin, TX (US)

(73) Assignee: Brian A. Korgel, Austin, TX (US)

( * ) Notice: Subject to any disclaimer, the term of this patent is extended or adjusted under 35 U.S.C. 154(b) by 51 days.

(21) Appl. No.: 12/004,276

(22) Filed: Dec. 20, 2007

(65) Prior Publication Data

US 2008/0248304 A1 Oct. 9, 2008

(51) Int. Cl.
*C30B 29/00* (2006.01)
*C30B 25/00* (2006.01)

(52) U.S. Cl. ............... 428/364; 428/373; 428/332; 977/762; 117/11; 117/84; 117/88

(58) Field of Classification Search ............... 428/357, 428/365, 397, 401, 364, 373, 332; 977/762; 117/11, 84, 88
See application file for complete search history.

(56) References Cited

U.S. PATENT DOCUMENTS

2003/0214699 A1* 11/2003 Banin et al. ............... 359/333
2004/0005723 A1* 1/2004 Empedocles et al. ............ 438/1

OTHER PUBLICATIONS

Greytak et al., "Growth and Transport Properties of Complementary Germanium Nanowire Field-Effect Transistors"; App. Physics Letters, vol. 84, No. 21, May 24, 2004, pp. 4176-4178.

Hanrath et al., "Chemical Surface Passivation of Ge Nanowires"; JACS Articles, J. Am. Chem. Soc., vol. 126, 2004, pp. 15466-15472.
Hanrath et al., "Influence of Surface States on Electron Transport Through Intrinsic Ge Nanowires"; J. Phys. Chem. B., vol. 109, 2005, pp. 5518-5524.
Hanrath et al., "Germanium Nanowires: Synthesis, Characterization, and Utilization"; Chemical Eng. Doctoral Dissertation. Univ. of Texas at Austin, 359 pages, 2004.
Wang et al., "Low-Temperature Synthesis of Single-Crystal Germanium Nanowires by Chemical Vapor Deposition"; Angew. Chem., Intl. Ed., vol. 41, No. 24, 2002, pp. 4738-4786.
Wang et al., "Surface Chemistry and Electrical Properties of Germanium Nanowires"; J. Am. Chem. Soc., vol. 126, 2004, pp. 11602-11611.
Blackburn et al., "Deposition of Conformal Copper and Nickel Films From Supercritical Carbon Dioxide"; Reports, Science, vol. 294, Oct. 2001, pp. 141-145.

(Continued)

*Primary Examiner*—D. Lawrence Tarazano
*Assistant Examiner*—Matthew D Matzek
(74) *Attorney, Agent, or Firm*—John A. Fortkort; Fortkort & Houston P.C.

(57) ABSTRACT

The present invention provides nanowires which are substantially straight and substantially free of nanoparticles and methods for making the same The nanowires can be made by seeded approaches, wherein nanocrystals bound to a substrate are used to promote growth of the nanowire. Nanocrystals in solution may also be used to make the nanowires of the present invention. Supercritical fluid reaction conditions can be used in a continuous or semi-batch process.

28 Claims, 13 Drawing Sheets

OTHER PUBLICATIONS

Brust et al., "Synthesis of Thiol-Derivatised Gold Nanoparticles in a Two-Phase Liquid-Liquid System"; J. Chem. Soc., Chem. Commun., 1994, pp. 801-802.

Coleman et al., "The Formation of Dimensionally Ordered Silicon Nanowires Within Mesoporous Silica"; The Journal of Am. Chem. Society, vol. 123, 2001, pp. 187-188.

Cui et al., "Functional Nanoscale Electronic Devices Assembled Using Silicon Nanowires Building Blocks"; Reports, Science, vol. 291, Feb. 2001, pp. 851-853.

Derycke et al., "Carbon Nanotube Inter-and Intramolecular Logic Gates"; Nano Letters, The American Chem. Society, vol. 1, No. 9, Sep. 2001, pp. 453-456.

Duan et al., "General Synthesis of Compound Semiconductor Nanowires"; Advanced Materials, Wiley-VCH, vol. 12, No. 4, 2000, pp. 298-302.

Gudiksen et al., "Diameter-Selective Synthesis of Semiconductor Nanowires"; The Journal of American Chem. Society, 2000, vol. 122, pp. 8801-8802.

Hanrath et al., "Nucleation and Growth of Germanium Nanowires Seeded by Organic Monolayer-Coated Gold Nanocrystals"; J. of Am. Chem. Soc., vol. 124, No. 7, 2002, pp. 1424-1429.

Heath et al., "A Liquid Solution Synthesis of Single Crystal Germanium Quantum Wires"; Chem. Phy. Letters, vol. 208, No. 3, 4; Jun. 1993, pp. 263-268.

Holmes et al., "Control of Thickness and Orientation of Solution-Grown Silicon Nanowires"; Reports, Science, vol. 287, Feb. 2000, pp. 1471-1473.

Hu et al., "Chemistry and Physics in One Dimension: Synthesis and Properties of Nanowires and Nanotubes"; Ac. of Chem. Res., Am. Chem. Soc., vol. 32, No. 5, 1999, pp. 435-445.

Kluth et al., "Thermal Behavior of Alkylsiloxane Self-Assembled Monolayers on the Oxidized Si(100) Surface"; Langmuir, Am. Chem. Soc., vol. 13, 1997, pp. 3775-3780.

Korgel et al., "Condensation of Ordered Nanocrystal Thin Films"; Physical Review Letters, The Am. Phy. Soc., vol. 80, No. 16, Apr. 1998, pp. 3531-3534.

Morales et al., "A Laser Ablation Method for the Synthesis of Crystalline Semiconductor Nanowires"; Science, vol. 279, Jan. 1998, pp. 208-211.

Odom, et al., "Atomic Structure and Electronic Properties of Single-Walled Carbon Nanotubes"; Letters to Nature, vol. 391, Jan. 1998, pp. 62-64.

Omi et al., "Self-Assembled Ge Nanowires Grown on Si (113)"; Appl. Phys. Lett., American Inst. of Physics, vol. 71, No. 15, Oct. 1997, pp. 2163-2165.

Shah et al., "Size-Selective Dispersion of Dodecanethiol-Coated Nanocrystals in Liquid and Supercritical Ethane by Density Tuning"; Journal Phys. Chem., American Chemical Society, vol. 106, 2002, pp. 2545-2551.

Shi et al., "A General Synthetic Route to III-V Compound Semiconductor Nanowires"; Adv. Materials, vol. 13, No. 8, Apr. 2001, pp. 591-594.

Trentler et al., "Solution-Liquid Solid Growth of Crystalline III-V Semiconductors: An Analogy to Vapor-Liquid-Solid Growth"; Rep., Science, vol. 270, Dec. 1995, pp. 1791-1794.

Wagner et al., "Study of the Filamentary Growth of Silicon Crystals From the Vapor"; J. of App. Phy., vol. 25, 1964, pp. 2993-3000.

Wu et al., "Germanium Nanowire Growth Via Simple Vapor Transport"; Chem. Mater., American Chemical Society, vol. 12, 2000, pp. 605-607.

Yaws et al., C.L. Handbook of Thermodynamic Diagrams; Gulf Publishing Company: Houston, Texas, 1996.

Zhang et al., "Germanium Nanowires Sheathed with an Oxide Layer"; Phy. Review, The Amer. Phy. Society, vol. 161, No. 7, 2000, pp. 4518-4521.

* cited by examiner

GROWTH OF SINGLE CRYSTAL NANOWIRES

STATEMENT OF GOVERNMENT RIGHTS

This invention was made with Government support from the National Science Foundation under Contract No. CTS-9984396. The government has certain rights in this invention.

CROSS-REFERENCE TO RELATED PATENT APPLICATIONS

This application claims priority to U.S. patent application Ser. No. 10/883,966, filed Jul. 6, 2004, bearing the same title and having the same inventors, allowed now issued as U.S. Pat. No. 7,335,259 on Feb. 26, 2008, which is incorporated herein by reference in its entirety, and which claims priority to provisional application No. 60/485,244, filed Jul. 8, 2003.

BACKGROUND

Nanowires can be useful in electronic and optical devices including integrated circuit interconnects, field effect transistors, photodetectors, biochemical sensors, light-emitting diodes, and complementary logic devices. Synthetic methods are known which do not rely on conventional lithographic techniques which yield silicon nanowires micrometers in length with diameters below 10 nm. The synthetic methods, however, are not necessarily commercially attractive. Thus, a need exists for a method for producing nanowires, including Group IV nanowires including silicon and germanium nanowires, which are of commercial interest. They should feature, for example, improved synthetic and morphological control and commercial production capabilities for providing high quantities of materials. In particular, a need exists for a method of producing nanowires which high quality: for example, they should be substantially straight and substantially free of corresponding nanoparticles, which can form along with the nanowires. In addition, material stability can be important, and surface passivation methods are also needed which are compatible with the nanowire synthesis.

SUMMARY

The present invention provides multiple embodiments which are summarized in this section. However, the scope of the present inventions should not be limited by the scope of this summary section.

For example, the present invention provides a process for growing crystalline Group IV metal nanowires comprising: providing a substrate comprising catalyst sites attached to the substrate surface, and continuously reacting the catalyst sites with a supercritical fluid mixture comprising at least one Group IV metal precursor, whereby crystalline Group IV metal nanowires grow from the catalyst sites. The catalyst sites can comprise nanoparticulates such as, for example, metallic nanocrystals. The attachment can be, for example, a covalent attachment. A cross sectional flow rate for the supercritical fluid mixture over the substrate and a reaction temperature can be controlled to produce nanowires which are substantially straight nanowires substantially free of nanoparticles.

In another embodiment, the present invention provides a process for preparing semiconductor nanowires comprising: growing Group IV metal nanowires under supercritical fluid conditions with use of seed catalyst particles, wherein the seed catalyst particles are attached to a substrate.

In another embodiment, the present invention provides a process for preparing Group IV metal nanowires substantially free of nanoparticles consisting essentially of: growing Group IV metal nanowires under supercritical fluid conditions with use of seed nanocrystals, wherein the seed nanocrystals are attached to a substrate, and a supercritical mixture is passed over the seed nanocrystals.

In another embodiment, the present invention provides a process for production of nanowires comprising: first passing a supercritical fluid mixture comprising a solvent and a group IV metal precursor over a substrate in the presence of catalyst seed particles, whereby nanowires are deposited onto the substrate; and second passing a washing solvent over the substrate to remove the nanowires from the substrate.

In another embodiment, the invention comprises a process for growing crystalline Group IV metal nanowires comprising: providing a dispersion comprising at least one Group IV metal precursor and nanoparticulate metallic catalyst, and continuously reacting the dispersion under supercritical fluid conditions, whereby crystalline Group IV metal nanowires grow from the nanoparticulate metallic catalyst.

In another embodiment, the invention comprises a process for growing passivated crystalline Group IV metal nanowires comprising: providing a dispersion comprising at least one Group IV metal precursor, at least one passivation agent, and nanoparticulate metallic catalyst, and continuously reacting the dispersion under supercritical fluid conditions, whereby crystalline Group IV metal nanowires grow from the nanoparticulate metallic catalyst.

In another embodiment, the invention comprises a process for growing crystalline Group IV metal nanowires comprising: providing a dispersion comprising at least one Group IV metal precursor and at least one precursor for nanoparticulate metallic catalyst, and continuously reacting the dispersion under supercritical fluid conditions to form Group IV metal and nanoparticulate metal catalyst, whereby crystalline Group IV metal nanowires grow from nanoparticulate metallic catalyst.

The invention, furthermore, provides a method of surface passivation of nanowires comprising: preparing nanowires with use of a supercritical fluid process in a reaction cell; passivating the nanowires without opening the reaction cell.

Articles and devices comprising nanowires, which are prepared by these methods, are also part of the invention.

The invention also provides compositions of matter including crystalline nanowires comprising group IV metal which are substantially straight and substantially free of nanoparticles.

Advantages provided by the nanowires of the present invention include: (1) the ability to prepare substantially straight nanowires; (2) the ability to prepare nanowires substantially free of nanoparticles; (3) the continuous production of nanowires, in quantities that are economically attractive; (4) the ability to functionalize the nanowire surfaces by chemical treatment without exposure to oxidizing atmospheric conditions; (5) the ability to control nanowire size; and (6) the ability to control kinetic parameters for process optimization. The ability to produce straighter, more uniform, defect-free nanowires represents a significant improvement over other presently available nanowires because they provide superior electronic properties for device application and pack easily into well-ordered two- or three-dimensional arrays. Examples of suitable devices in which the nanowires may be used include, but are not limited to field effect transistors, lasers, photodetectors, biochemical sensors, light emitting diodes, complementary logic devices and non-volatile memory devices.

DETAILED DESCRIPTION OF THE INVENTION

Methods are provided for synthesizing nanowires by thermally degrading a Group IV organometallic precursor in a supercritical fluid in the presence of nanocrystals or nanoparticulates, or nanocrystal precursors or nanoparticulate precursors. The processes can be continuous or semi-batch processes. The nanocrystals or nanocrystal precursors can be tethered to an appropriate substrate surface or dispersed freely in solution. The resulting nanowires may be characterized by narrow diameters and size distributions. The use of supercritical fluids allows for the dispersion of high concentrations of nanocrystals and precursors in the fluid while maintaining high diffusion coefficients. This combination leads to fast and efficient nanowire production. Moreover, the ability to manipulate precursor concentration, nanocrystal concentration and size, and the solvent strength of the supercritical fluid via temperature and pressure provides flexibility in controlling the nanowire composition and morphology.

The inventors have surprisingly and unexpectedly discovered that by utilizing a flow reactor in combination with tethered nanocrystals in the production of the nanowires, substantially straight and substantially defect-free nanowires may be manufactured without sacrificing nanowire length and without the production of significant amounts of nanoparticles which are often produced in competitive reactions during nanowire production. The flow reactor provides kinetic tunability that minimizes undesirable particle deposition and optimizes the production of straight nanowires. The flow reactors provide superior results relative to batch processes due, at least in part, to a reduction in homogenous nucleation and growth of nanoparticles in the fluid phase. The reduction in nanoparticle growth and the increase in nanowire straightness may be optimized using the appropriate pressure, temperature, and flow rates. Without intending to be bound to any particular theory, the inventors believe the advantages of the flow reactor are that is provides (1) fluid-phase reactant concentrations that vary less significantly with time than other reactors due to the ability to control reactant concentration flow rate; and (2) a means to flush particulates formed in the fluid phase before depositing on the substrate. Thus, continuous and semi-batch processes are capable of producing nanowires having very different and higher quality structures than their batch process counterparts.

Figure 1:
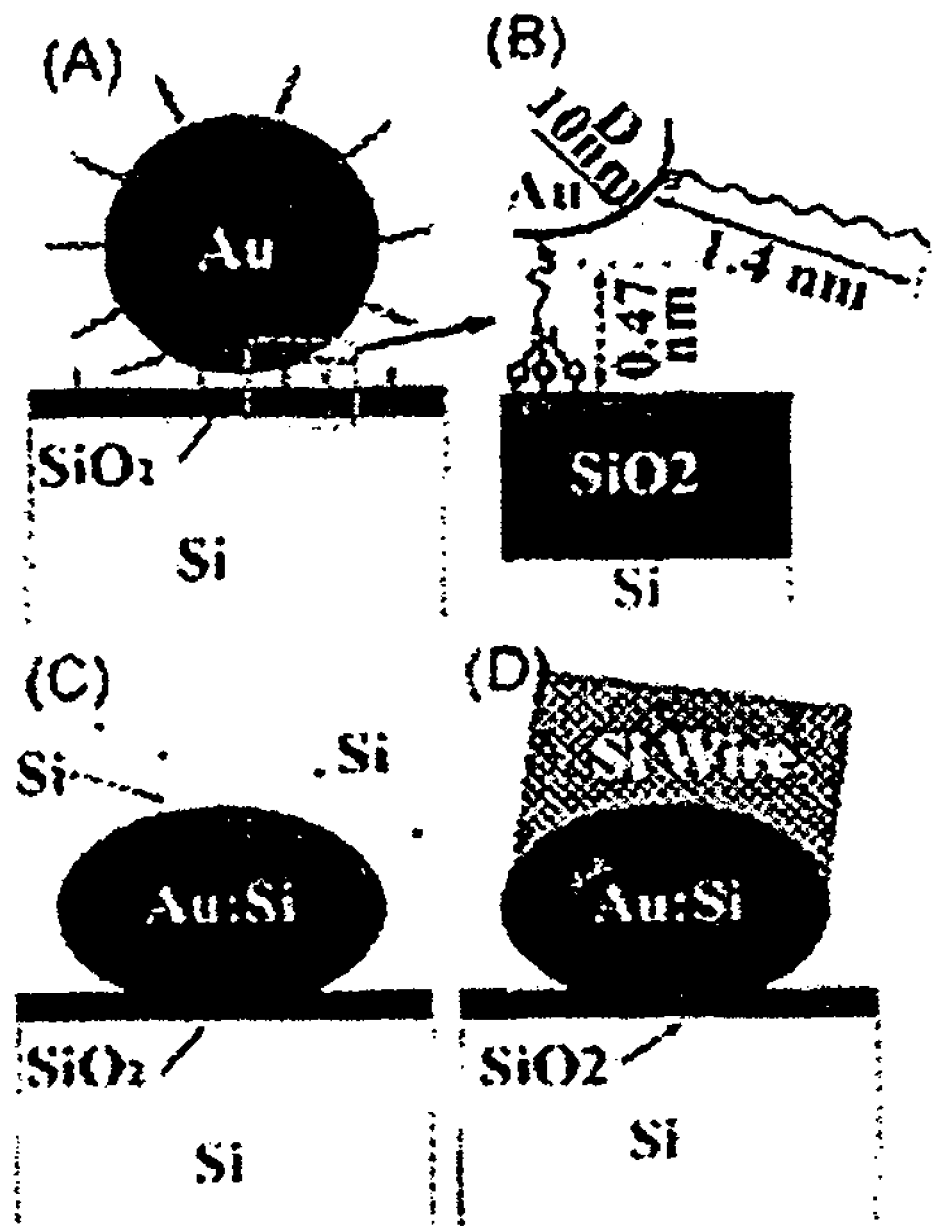
FIG. 1A-D provides a schematic of a nanowire synthesis from tethered sterically stabilized nanocrystals.

FIG. 1 shows a schematic of a preferred embodiment for producing the nanowires. In FIG. 1A, a substrate is provided which comprises silicon having a silicon dioxide surface. The surface can be modified with a surface treatment to promote adsorption of a nanocrystal. Onto this modified surface, the nanocrystal can be adsorbed. The nanocrystals can be surface treated to provide for steric stabilization. In other words, as shown in FIG. 1A, tethered, sterically stabilized gold nanocrystals can be used as seeds for further synthesis of nanowires, wherein the gold nanoparticles are adsorbed to the modified silicon substrate. FIG. 1B provides an enlarged view of the selected region in (A), showing dimensions such as the length of the sterically stabilizing group, the size of the nanocrystal, and the distance between the substrate surface and the nanocrystal. In FIG. 1B, this distance is occupied largely by the coupling agent. In FIG. 1C, the degradation of diphenyl silane (DPS) to form Si atoms is shown. These Si atoms can dissolve into the nanocrystals to form alloy droplets on the substrate surface. In FIG. 1D, the Si nanowires crystallize from the Au nanocrystal seeds upon saturation of the particles.

Additional discussion for the present invention, including background and theoretical discussion, can be found in "Growth of Single Crystal Silicon Nanowires in Supercritical Solution from Tethered Gold Particles on a Silicon Substrate" by Lu et al., *NanoLetters,* 2003, Vol. 3, No. 1, 93-99, particularly the first four paragraphs, the entire disclosure of which is incorporated herein by reference.

U.S. Patent Publication 2002/0172820 to Majumdar et al. (published Nov. 21, 2002) discloses nanowires.

In addition, the following references can be used as guide to practicing the present invention: (1) Madou, *Fundamentals of Microfabrication, 2nd Ed.*, CRC Press, 2002 (for example, the properties and growth of silicon, including crystalline silicon, are described at pages 125-204); (2) "Control of Thickness and Orientation of Solution-Grown Silicon Nanowires"; Holmes et al., *Science,* Vol. 287, Feb. 25, 2000, pages 1471-1473 (this reference discloses bulk quantities of defect-free silicon nanowires with nearly uniform diameters ranging from 40-50 angstroms grown to several micrometers with a supercritical fluid solution-phase approach); (3) "A Laser Ablation Method for the Synthesis of Crystalline Semiconductor Nanowires"; Morales et al., *Science,* Vol. 279, Jan. 9, 1998, pages 208-211; (4) "Nucleation and Growth of Germanium Nanowires Seeded by Organic Monolayer-Coated Gold Nanocrystals"; Hanrath et al.; *J. Am. Chem. Soc.*, Vol. 124, No. 7, 2002, pages 1424-1429; (5) U.S. Patent publication, 2003/0003300 A1 published Jan. 2, 2003 to Korgel and Johnston, in particular, describing supercritical fluid processes and use of organic silicon precursors to form silicon nanoparticles; and (6) "Supercritical Fluid-Liquid-Solid (SFLS) Synthesis of Si and Ge Nanowires Seeded by Colloidal Metal Nanocrystals," Hanrath, T. et al., *Advanced Materials*, 2003, 15, No. 5, Mar. 4, pages 437-440.

A nanowire is an individual nanowire, desirably a single crystal solid structure. The length, diameter and aspect ratio (ratio of length over diameter) of nanowires may vary over a considerable range. For example, the nanowires can have an average diameter of about 5 nm to about 50 nm, and more particularly, about 10 nm to about 20 nm. The length of the nanowires may vary, from a few microns to a hundreds of microns. In one typical embodiment, the nanowires may have an average length of about at least one micron, and more particularly, about at least 5 microns. Generally nanowire may be characterized by an aspect ratio of 100 or larger and a diameter generally less than about 50 nm. For the purposes of this disclosure, the term nanowire also includes other nanometer-sized generally cylindrical structures that may go by different names, such as nanorods, nanofilaments, or nanowhiskers.

Nanowires are a plurality of these individual nanowires, a collection of single solid structures which in theory can be physically separated from each other and characterized individually. Statistical methods, therefore, can be used to characterize nanowires such as average diameter, average length, and distributions. In many cases, narrow distributions such as monodisperse distributions are more desired than broader distributions. In general, the individual nanowires have the same composition when prepared from a common production method. Upon production of the nanowires, isolation methods can be used, if desired, to separate fractions of subsets of nanowires. Individual nanowires can be isolated and characterized, and remixed if desired.

The nanowires can be crystalline including single crystal nanowires. Single crystal characteristics can be determined by high resolution transmission electron microscopy (HR-TEM) analysis., In some embodiments, over 75 percent of the nanowires produced in accordance with the methods of this invention are crystalline. This includes embodiments where over 80 percent of the nanowires are crystalline and further includes embodiments where over 90 percent of the nanowires are crystalline.

The nanowires can comprise, for example, Group IV metals including silicon, germanium, tin, lead, and combinations thereof. The nanowires can comprise at least 90 atomic percent, or at least 98 atomic percent, of the Group IV metal. Nanowires comprising silicon may be particularly desirable.

The nanowires are desirably substantially straight. As such, they may be substantially free of tortuous morphology such as kinks, curls, or bends, and substantially free of defects in the structure such as defects in a crystal lattice. For the purposes of this disclosure, the straightness of a nanowire may be characterized by a straightness parameter which is the ratio of the shortest end-to-end length measured along the surface of a nanowire divided by the shortest distance between two endpoints located at opposite ends of that nanowire. Using this standard, a perfectly straight nanowire has a straightness parameter equal to 1. The production process described by this invention can be varied to provide substantially straight, and even completely straight nanowires (i.e. nanowires having a straightness parameter of about 1 or close to 1 such as, for example, 1.1). In some embodiments, the nanowires produced in accordance with the methods of the present invention will have an average straightness parameter of no more than 3. This includes embodiments where the nanowires produced in accordance with the methods of the present invention have an average straightness parameter of no more than about 2 and further includes embodiments where the nanowires produced in accordance with the methods of the present invention have an average straightness parameter of no more than about 1.5. Depending on the intended application of the nanowires, one skilled in the art can determine whether the collection of individual nanowires has a low enough content of nanowires which are not as straight as desired.

The nanowires (of a given composition) can be manufactured such that they are substantially free or totally free of nanoparticles of the same or similar composition, in particular nanoparticles which can be potentially formed as a competitive reaction during the formation of the nanowires. In some synthetic approaches, the formation of the nanowire competes with the formation of nanoparticles, and conditions are preferred which result in nanowire production rather than nanoparticle production. For example, the nanoparticles are preferably produced in an amount of less than about 10 wt. %, and more preferably, less than about 5 wt. %, and more preferably, less than about 1 wt. % of the total mass of nanowire and nanoparticle production. When forming silicon nanowires, for example, the amount of silicon nanoparticle in the collection of silicon nanowires can be less than 5 wt. %, and less than 1 wt. % (based on combined weight of nanowires and nanoparticles). Because the nanowires can be tethered to the substrate during formation, any unbound nanoparticles may be flushed away in the flow reactor. Additionally, the nanowires can be treated by, for example, washing with solvent to remove free nanoparticles, particularly when the nanowires are bound to a substrate and the nanoparticles are not bound. For a given application, one skilled in the art can experiment and determine whether the amount of nanoparticle formation is too high.

In saying that the nanowires are free or substantially free of nanoparticles, the following embodiment is not excluded: the nanowires can include nanocrystals at the end which are physically part of the nanowire. The nanowires can comprise nanocrystals, preferably metallic nanocrystals, at the ends of the nanowires, preferably at only one of the two ends. This terminal nanocrystal can result from the synthetic approach, wherein nanocrystals are used to seed the production of nanowires. In one embodiment, substantially all of the individual nanowires comprise the nanocrystal at the end. Examples of nanocrystals include gold, silver, iron, titanium, nickel, and aluminum. The size of the nanocrystal can determine the diameter of the nanowire which grows from the nanocrystal. Preferred sizes for the nanocrystal seed particle are within the range 2-25 nm in diameter.

Once the growth of the nanowires has proceeded to the desired extent, the nanowires may be removed (untethered) from the substrate using sonication in a suitable solvent or washing under suitable conditions. This process also allows for control of nanowire length. Specifically, the length of the nanowires may be controlled by the level ultra sonic treatment that the wires are subjected to after synthesis. By increasing the extent of the sonication, the average nanowire length can be substantially reduced to a few microns from an initial average length of hundreds of microns.

Any suitable continuous reaction process can be used to produce the nanowires of the present invention provided that process provides sufficient control of the flow of reactant materials over the substrate to produce substantially straight, substantially defect-free nanowires, desirably with the substantial absence of nanoparticles. Thus, suitable production processes will include both continuous and semi-batch processes. A variety of suitable flow reactors are known and commercially available, including those designed to withstand the temperature and pressure of supercritical fluid conditions.

The process for preparing the nanowires according to the invention may comprise a combination of steps. In an initial step, a substrate may be provided which comprises nanocrystals, such as metallic nanocrystals, or nanocrystal precursors covalently attached (tethered) to the substrate surface using known reactions. Examples of suitable substrates, including substrate surfaces, include silicon, and germanium, mica and highly ordered pyrolytic graphite. The substrate can be treated if desired to have a surface layer or coating, and either monolithic or multi-layered structures can be used. For example, the substrate may be silicon or germanium coated with a thermal oxide, gold, or aluminum. The nanocrystals or nanocrystal precursors may be tethered to the surface using known reactions. For example, coupling agents can be used to covalently attach the nanocrystals to the surface. Suitable coupling agents include, but are not limited to, silane coupling agents which have a reactive moiety which binds to the substrate surface and a functional group which allows for attachment of the nanocrystal. The thickness of the layer of coupling agent may vary. In some embodiments, the thickness of the layer will be about 5 nm or as small as 1 nm. The surface coverage of the substrate by the tethered nanocrystals or nanocrystal precursors can be controlled by controlling the reaction conditions under which the nanocrystals or nanocrystal precursors are bound to the substrate surface. In some embodiments, the surface coverage is desirably low. For example, the surface coverage by the tethered nanocrystals or nanocrystal precursors may be less than 10%, less than 5%, or less than 3%. The nanocrystals preferably are relatively uniformly distributed on the substrate surface. The nanocrystals preferably are not clumped together.

Nanocrystals or nanocrystal precursors can be contacted with the substrate surface in the form of colloidal dispersions, and the suspended nanocrystal can be transferred to the substrate by adsorption. The nanocrystals can be sterically stabilized with the use of, for example, adsorbed alkyl groups including $C_5$-$C_{100}$ alkyl groups, and more particularly, $C_6$-$C_{20}$ alkyl groups. For example, alkane sulfur compounds including alkane thiols such as dodecane thiol can be used to stabilize the nanocrystals. The steric stabilization layer can extend, for example, about 1 nm to about 5 nm from the particle.

In an alternative step, the nanocrystals or nanocrystal precursors may not be attached to a substrate in any way. The nanocrystals may be freely dispersed in a solution comprising at least one organic solvent. The solution may also contain Group IV metal precursor, or Group IV metal precursor may be later exposed to the nanocrystals or nanocrystal precursors during a reaction step under appropriate reaction conditions.

In a subsequent step, the process comprises continuously reacting the nanocrystals or nanocrystal precursors with Group IV metal precursor in a supercritical fluid environment. The Group IV precursor may comprise at least one Group IV organometallic compound and the supercritical fluid may comprises at least one organic solvent. The organic solvent provides a supercritical fluid by heating the solvent above its critical temperature at a pressure above its critical pressure. The critical temperature and critical pressure for a fluid is known as the critical point. One skilled in the art can determine what pressures and temperatures are needed to achieve the supercritical fluid state for a particular solvent system, without undesired degradation. Above the critical point, neither a liquid nor gas state exists. Instead a phase known as a supercritical fluid exists. For example, a gas enters the supercritical state when the combination of pressure and temperature of the environment in which the gas is contained is above a critical state. The critical temperature and pressure of other components may be readily calculated or experimentally determined. Supercritical fluids may have high solvating capabilities that are typically associated with compositions in the liquid state. Supercritical fluids also have a low viscosity that is characteristic of compositions in the gaseous state. Additionally, a supercritical fluid maintains a liquid's ability to dissolve substances.

Generally, the solvent may be any solvent with an accessible supercritical state that is capable of dissolving the chosen precursor molecules. Examples of solvents that may be used include, but are not limited to, hydrocarbons, alcohols, ketones, ethers and polar aprotic solvents (e.g., dimethyl formamide, dimethyl sulfoxide, etc). Hydrocarbon solvents include, but are not limited to aromatic and non-aromatic hydrocarbons. Examples of aromatic hydrocarbon solvents include, but are not limited to benzene, toluene, and xylenes. Examples of non-aromatic hydrocarbon solvents include cyclic hydrocarbons (e.g., cyclohexane, methylcyclohexane, cyclopentane, methylcyclopentane, etc.) and aliphatic hydrocarbons (e.g., pentane, hexane, heptane, octane, iso-octane, etc.). Octanol and cyclohexane are particularly suitable organic solvents. The critical temperature of octanol, for example, is 385° C., and the critical pressure of octanol is 34.5 bar. When octanol is subjected to temperatures and pressures above 385° C. and 34.5 bar, the octanol exists in a supercritical state. The supercritical temperature and pressure for cyclohexane are 280° C. and 40.5 bar, respectively.

The organometallic Group IV precursor can be a Group IV metal compound that includes organic groups. As used herein, a "Group IV metal" includes the elements of silicon, germanium, tin, and lead. Generally, organometallic Group IV precursors are compounds that may be thermally degraded to form nanowires that are composed primarily of the Group IV metal. In some embodiments, the nanowire contains a mixture of Group IV elements, such as $Si_xGe_{1-x}$, $Si_xSn_{1-x}$ or $Ge_xSn_{1-x}$. Organometallic Group IV precursors include, but are not limited to organosilicon, organogermanium, organotin, and organolead compounds. Examples of Group IV precursors include, but are not limited to, alkylsilanes, alkylgermanes, alkylstannanes, alkylplumbanes, chlorosilanes, chlorogermanes, chlorostannanes, chloroplumbanes, aromatic silanes, aromatic germanes, aromatic stannanes, and aromatic plumbanes. Particular examples of organometallic silicon precursors include, but are not limited to, tetraethyl silane, diphenylsilane, and monophenylsilane. Particular examples of organometallic germanium precursors include, but are not limited to, tetraethylgermane or diphenylgermane. When a substrate is used for the formation of nanowires, the substrate is treated with the organometallic Group IV precursor, even though the organometallic Group IV precursor begins reacting and decomposing when heated. It may not be clear whether the precursor has already fully decomposed by the time it reaches the substrate. When the nanocrystals are freely dispersed in solution rather than tethered to a substrate, the organometallic Group IV precursor is preferably in solution with the nanocrystals prior to being exposed to the supercritical fluid under reaction conditions. However, the organometallic Group IV precursor and nanocrystals may also be separated until reacted in a supercritical fluid environment under appropriate reaction conditions.

The nanocrystal precursor may be any organometallic compound that reacts in situ to form the metal nanocrystals that will subsequently direct the growth of the semiconductor nanowires. For example, instead of adding colloidal metal nanocrystals, such as Al nanocrystals, an organometallic precursor, such as trioctylaluminum, may be added that will decompose into Al nanocrystals under appropriate reaction conditions. Examples of organometallic precursors include, but are not limited to trialkylaluminum compounds (trimethylaluminum, triethylaluminum, tributylaluminum, trioctylaluminum, etc.), metal carbonyl compounds ($Fe(CO)_5$, $Fe_2(CO)_9$, $Co_2(CO)_8$), and gold salts with reducing agents ($HAuCl_4/NaBH_4$).

The surface of the nanowires of the present invention may be modified in situ during a continuous or batch process of this invention by the addition of surface modifying agents during or after the formation of nanowires. A number of modifications may be made, and one of skill in the art may readily choose agents that modify surface characteristics depending on the particular application of the present invention. For example, agents may be chosen to passivate the surface of the nanowires of the present invention. Surface-passivating agents include, but are not limited to 1-alkenes, such as 1-hexene, 1-octene, 1-dodecene, 1-hexadecene, 1-octadecene; alcohols, such as 1-octanol, 1-dodecanol; and thiols such as 1-hexanethiol, 1-octanethiol, 1-dodecanthiol. Example 4 below shows a Ge nanowire passivated with 1-hexene. The Ge nanowire of Example 4 shows very little surface oxidation after passivation with 1-hexene.

As noted above, both continuous reactions and semi-batch reactions can be used to produce the nanowires of the present invention. Exemplary continuous reaction processes are described in detail in the examples sections below. An example of a flow reactor for use in a continuous process is provided in FIG. 2. The details of one flow reactor are provided in the working examples below. The elements of the flow reactor include a high pressure reaction cell, equipped with an inlet region and an outlet region. The reaction cell can be designed for loading in the substrate, allowing reactants to enter into the cell by the inlet region, allowing exhaust to exit the cell by the outlet region, and thermal control. The reaction cell can be equipped at one end, the outlet region, with a back pressure regulator. At the other end, the inlet region, the reaction cell can be equipped with a preheater zone. A plurality of lines can be used to allow the solvent, the reactive Group IV metal compound, or both into the preheater zone.

A typical semi-batch process may be carried out as follows: nanowires formed by the reaction of precursor molecules with tethered nanocrystals are deposited on a substrate, such as a silicon substrate, located inside a suitable reactor, such as a Ti reactor. After synthesis the deposited nanowire product material is cleaned by rinsing the reactor cell with supercritical solvent, such as hexane. The nanowires may then be removed by vigorous flushing with the supercritical solvent. At this point the substrate is effectively clean and subsequent reactions are possible by recharging the reactor with reagents and repeating the synthetic process. Alternatively, the conditions may be altered to allow for post-synthesis modification of the nanowires. In this embodiment, a semi-batch process is used wherein the nanowires may be ejected from the reactor and collected in a receiving vessel in which wet chemistry is used to modify the nanowire surface chemistry. This may be accomplished without exposing the nanowires to oxidizing atmospheric conditions. Surface functionalization of the nanowires may be accomplished by transferring the nanocrystals (either on a substrate or in solution) under inert atmosphere (argon or nitrogen gas) into a vessel containing the desired reagent(s) and solvent. Examples of suitable derivatization reagents include alcohols (such as butanol, octanol, dodecanol, etc.), alkenes (such as octene, dodecene, hexadecene, etc.), chlorosilanes (such as octyltrichlorosilane), and thiols (such as octanethiol, dodecanethiol, etc.). Solution-phase chemical synthesis (described below) is then used to derivatize the nanowire surface. This approach may be desirable because it can be adapted to the synthesis of large quantities of nanowires by simply recharging the reactor with reagents after expunging the formed nanowire material. An example of a batch-process for use in functionalizing Ge nanowires is presented in example 2, below.

Reaction temperatures, pressures, and times for both continuous and semi-batch reactions may vary depending on the nature of the reactants and the desired quality of the nanowires. The reaction temperature and pressure should be sufficiently high to provide a supercritical fluid reaction but not so high as to prematurely decompose the precursors. One skilled in the art can determine which temperatures and pressures, for a particular experimental setup, provide the correct combination of reactivity and lack of decomposition to provide the substantially straight crystalline nanowires which are substantially free of nanoparticles. Typical reaction pressures for the supercritical fluids mentioned herein may be about 10 MPa to about 100 MPa, more particularly, about 15 MPa to about 50 MPa. Typical reaction temperature for the supercritical fluids mentioned herein may be about 350° C. to about 800° C., and more particularly, about 500° C. to about 600° C. The reaction time is not particularly limited but can be optimized for a given application. After reaction is terminated, the substrate can be washed or flushed with substantially pure solvent, without precursor, to remove nanoparticles. Alternatively, the nanoparticles may be removed from the surface through sonication in a suitable solvent.

The concentration of the organometallic Group IV precursor can be varied. In some embodiments, the concentration of the organometallic Group IV precursor will be 0.1 M to 0.9 M, and more particularly, about 0.1 M to about 0.4 M.

Flow rate of organometallic Group IV precursor across the substrate surface area can be an important parameter. In general, lower flow rates are preferred. For example, a cross sectional flow rate parameter can be established by dividing the flow rate (mL/min) by the square centimeters of substrate area ($cm^2$). Based on the working examples, for example, good results were achieved with flow rate of 0.5 mL/min and substrate areas of 5×20 mm (1 $cm^2$). Cross sectional flow rates below about 1.0 mL/min-$cm^2$ can be used.

Although the theory of the present invention is not fully understood, it is believed that modeling and kinetic studies can be used to help explain and practice the invention, particularly for the silicon embodiment. The transition between straight and tortuous wires depends on temperature. High temperatures tend to favor straight nanowires. Sufficient Si atoms can arrive at the crystallization sites to drive the growth of a 1-D crystalline silicon nanowire. If the growth site is starved with respect to silicon atoms, or if crystallization is slow, the likelihood of incorporating a contaminant into the growing crystal to produce a defect becomes significant. Both increased temperature and diphenyl silane (DPS) concentration enhance the Si atom supply rate, which favor straight wires. However, very high DPS concentrations produce large amounts of homogeneously nucleated Si particles in addition to the heterogeneously nucleated nanowires. Presumably, there exists an important precursor concentration above which the heterogeneous nucleation pathway leading to nanowires is overwhelmed by homogeneous nucleation to form Si nanoparticles. By manipulating both the DPS concentration and the flow rate, the flow reactor can enable the production of straight wires with minimal Si particulate formation on the substrate. At a DPS concentration of 0.25 M and 500° C., the wires produced at a low flow rate of 0.5 mL/min in FIG. 5A were straight and clean, whereas those produced in the batch reactor were shorter and surrounded by large quantities of Si particles (FIG. 4B). A kinetic analysis of the flow system explains qualitatively the ability to produce straight wires with minimal nanoparticles in a flow reactor.

In other embodiments (see, for example, Example 3 below), a substrate is not used, and the nanowires may simply be collected from the reaction cell. Sonication may still be used to control the length of the nanowires. The nanowires can be in a suitable solvent and not attached to a substrate during sonication. Using the same principle as previously described, increasing the level of sonication can result in nanowires with a decreased average length. In embodiments such as Example 3, the concentration of the Group IV organometallic precursor can range from, for example, about 0.001 M to about 0.9 M. The molar ratio of the amount of Group IV organometallic precursor to metal nanocrystals can range from 10,000:1 to 100:1, with 1000:1 being optimal.

In other embodiments as illustrated in Example 4 below, the concentration of the Group IV organometallic precursor can range from about 0.001 M to about 0.9 M. The molar ratio of the amount of Group IV organometallic precursor to metal nanocrystals can range from about 10,000:1 to about 100:1, with 1000:1 being optimal. The amount of surface passivating agent is preferably no more than about 40% (by volume with respect to the solvent), with about 10% being optimal.

Working Examples

In Example 1 below, nanowires were produced in accordance with the present invention using a continuous flow reactor. As a comparative example, nanowires were also produced using a batch process. The results demonstrate that the continuous process unexpectedly produces superior nanowires. In Example 2 below, surface functionalized nanowires were produced in accordance with the present invention using a semi-batch process. In Example 3, Ge nanowires were produced using a continuous flow reactor in accordance with the present invention. Example 3 is similar to Example 1, but the metal nanocrystals that direct nanowire growth are dispersed freely in solution rather than tethered to a substrate as in Example 1. In Example 4 below, Ge nanowires were produced with simultaneous in situ passivation in accordance with the present invention. This example is similar to Example 3 except a surface passivating agent was added to the reaction solution containing the Ge precursor and the metal nanocrystals. In Example 5 below, Ge nanowires were formed in a process similar to Example 3 except the metal nanocrystals were formed in situ using organometallic precursors rather than adding already-made nanocrystals to the reaction solution.

Example 1

Comparison of Continuous and Batch Production

A. Experimental

Si Substrate Preparation. A Si wafer (<100>, with thermal oxide 10 nm, Wafer World, Inc.) was cut into 5×20 mm samples that were degreased with distilled deionized water (D—$H_2O$) and acetone in an ultra-sonic bath. These small Si substrates were immersed in a HCl/methanol (w/w=1:1) solution and then 98% $H_2SO_4$, each for 30 min. After rinsing with D—$H_2O$ and drying with $N_2$, the substrates were immersed for 1 h in a dilute aqueous solution of 1:1:40 (v/v/v) 3-mercaptopropyltrimethoxysilane, MPTMS (Gelest, Inc.)/D—$H_2O$/isopropyl alcohol to functionalize the surface. The MPTMS-treated Si substrate was transferred to a colloidal dispersion of alkanethiol-coated Au nanocrystals in chloroform. The Au nanocrystals were synthesize according to the procedures described in the literature (see references 22 and 23). This procedure was:

Dissolved 0.154 g $HAuCl_4$ in 15 mL D—$H_2O$ and 1.114 g $(C_8H_{17})4$-NBr in 10.2 mL $CHCl_3$. Combined the solutions obtained and stirred for 1 h. Collected the organic phase and added 100 microliters of dodecanethiol $(C_{12}H_{25}SH)$ into it while stirring. Dissolved 0.197 g $NaBH_4$ in 12.5 mL D—H20 and added the solution to the stirring organic phase, too. Stirred 8 h. Collected the organic phase, which was rich in gold nanocrystals.

After incubating for 2 to 10 h at room temperature, the substrate was rinsed with and stored in D—$H_2O$ for later use.

Nanowire Synthesis. Diphenylsilane (DPS, Gelest) was stored in an inert atmosphere under $N_2$. Feedstock solutions of DPS in anhydrous cyclohexane (Aldrich Chemical Co.) were prepared in a $N_2$ glovebox with concentrations ranging from 0.1 to 0.9 M.

Batch reactions were carried out by loading an MPTMS and Au nanocrystal-treated Si substrate and 0.5 mL DPS feedstock solution into a 1 mL titanium grade-2 cell (0.5 cm i.d., 2.0 cm o.d., and 7.0 cm long with a titanium grade-2 LM6 HIP gland and plug, High Pressure Equipment, Inc.) in a $N_2$ glovebox. A brass block (7×25×17 cm) designed to hold up to six reactors was used to heat the reactor. The block was thermostated with a thermocouple (Omega, Inc.) and a temperature controller and heated by four 300 W ¼ in. diameter by 4.5 in. long cartridge heaters (Omega). The block was heated to the desired reaction temperature prior to inserting the cell. The cell was inserted into the preheated block and reached the synthesis temperature within a few minutes with a calculated pressure (see reference 24) of 29.0 mpA. The reaction proceeded another 15 min at this temperature. A special cell filled with a thermocouple verified that significant temperature gradients do not occur during the reaction and that the cell interior rapidly reaches synthesis temperature. The reaction was quenched by rotating the brass block upside down with a cable and sliding the cell by gravity into an ice-water bath. The cell contents cooled to less than 50° C. in two minutes. The entire device was shielded heavily with polycarbonate barricades.

Figure 2:
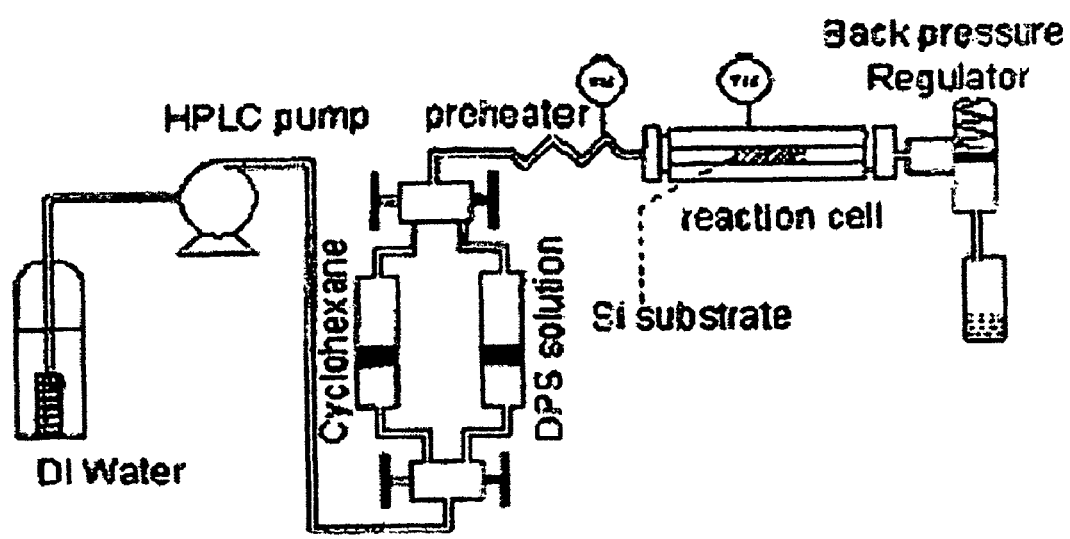
FIG. 2 provides a schematic of the flow reactors which can be used to synthesize nanowires.

The flow reactor was a 2 mL (0.5 cm i.d., 2.0 cm o.d., and 12.5 cm long) high-pressure titanium grade-2 cell with both ends connected to 1/16 in. o.d. and 0.03 in, i.d. stainless steel high-pressure tubing via titanium grade-2 LM-6 HIP reducers (High Pressure Equipment) (FIG. 2.) Cyclohexane and a modified Si substrate were loaded into the cell under an inert $N_2$ atmosphere in a glovebox. Two stainless steel cylinders (1.7 cm id., 2.5 cm o.d., and 20 cm long) were equipped with stainless steel pistons and ethylene propylene O-rings. In the glovebox, one of these cylinders was loaded with cyclohexane and the other with DPS/cyclohexane stock solution. The cylinders were removed from the glovebox and connected to the preheater tubing. The reaction cell was then removed from the glovebox and connected via a three-way valve to the preheater tubing. The preheater tubing and the reaction cell were covered with heating tape and glass wool insulation and heated from 300° C. to 350° C. and 350° C. to 500° C., respectively, in 3 to 5 min. The temperature was measured by thermocouples under the heating tape and controlled to within about 5° C. in the preheater and 1° C. in the reactor. The cylinder containing pure cyclohexane was pressurized by pumping D-H$_2$O into the back of the piston using an HPLC (high pressure liquid chromatography) pump (Thermoquest) to inject oxygen-free cyclohexane through the preheater tubing and into the reaction cell until reaching the desired pressure. The valves to the first cylinder containing only solvent were closed and the DPS feed solution valves were opened. The HPLC pump controlled the DPS solution flow rates, which ranged from 0.5 to 3 mL/min. An SS-4R3A back-pressure regulator (Swagelok) connected after the reaction cell and a digital pressure gauge (Stratford) between the preheater tubing and the cell maintained the pressure at 24.1±1.4 MPa. The reaction proceeded for 5 min before switching the valves back to the solvent cylinder. Solvent was flushed through the cell at 3 mL/min to remove undesired reaction byproducts and particulates from the system.

Materials Characterization. A LEO 1530 high-resolution scanning electron microscope (HRSEM) was used with a 10 kV accelerating voltage to study the morphology of the nanowires on the Si substrate. X-ray photoelectron spectroscopy (XPS) was performed using a Physical Electronics XPS 5700 equipped with monochromatic Al X-ray source (Al Kα, 1.4866 keV). High resolution transmission electron microscopy (HRTEM) and selected area electron diffraction (SAED) were performed using a JEOL 2010F TEM operating at 200 kV. Images were obtained primarily with a GATAN digital photography system. To avoid structural damage to the nanowires that occurs with sonication or solvent redispersion, samples were prepared for HRTEM by scratching the surface of the silicon substrate with carbon-coated 200 mesh Cu grids (Electron Microscope Sciences).

B. Grafting Nanocrystals onto a Surface

Figure 3:
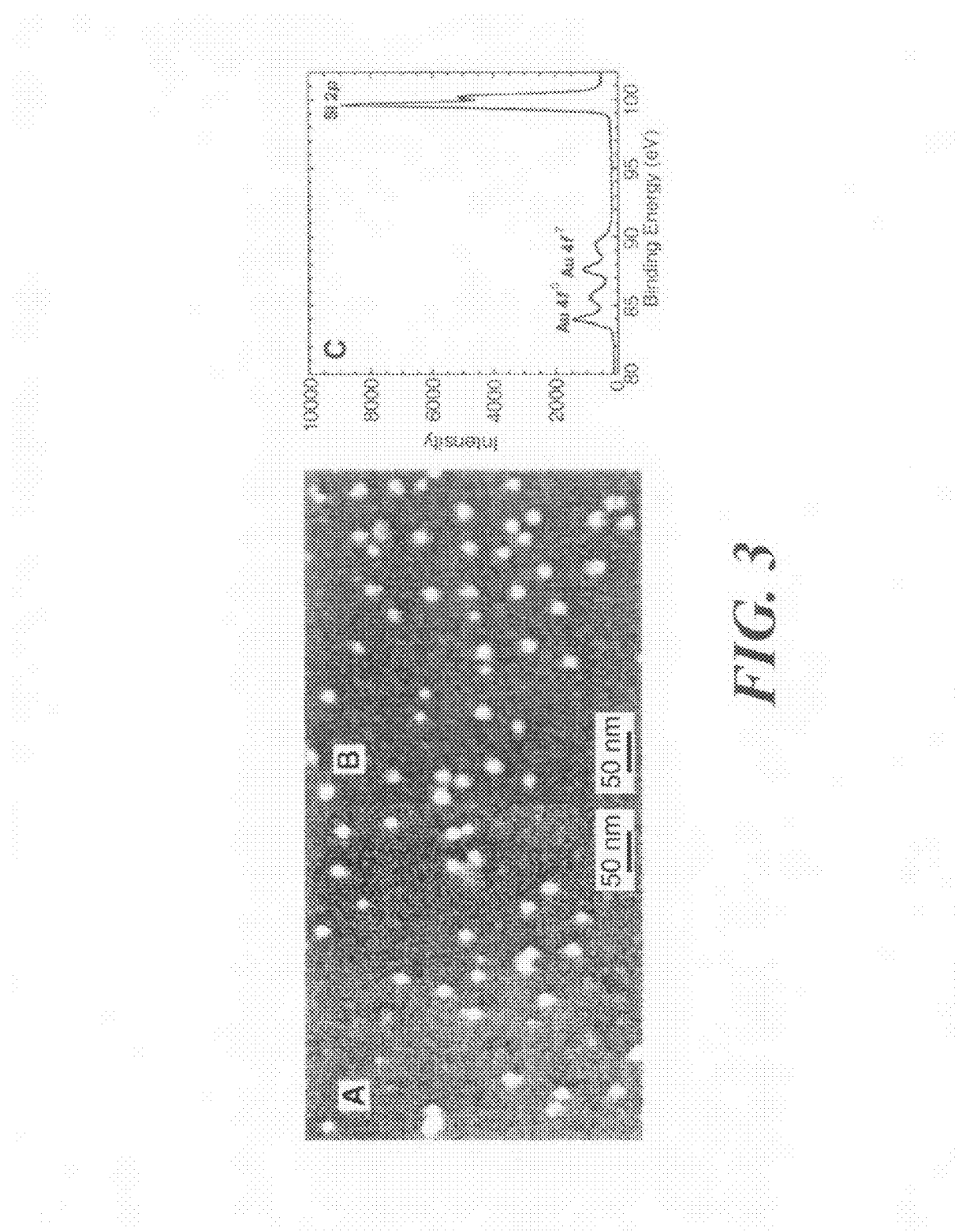
FIG. 3A-C provides images and XPS analysis of a substrate after grafting nanocrystals to the surface.

FIG. 3A shows an HRSEM image of a Si substrate after grafting Au nanocrystals to the surface. The average diameter of the gold particles was 12.95±3.69 nm. In a control experiment, FIG. 3B shows the HRSEM image of the Si substrate with gold particles after being subjected to the reaction condition (T=500° C., P=24.1 MPa, flowing cyclohexane). The gold particles have an average diameter of 13.09±2.67 nm. There was no significant change in the Au nanocrystal size distribution, indicating minimal particle aggregation. This observation was consistent with the siloxane monolayer being stable at least up to 815 K (see reference 25). FIG. 3C shows an XPS of a Si substrate after grafting Au nanocrystals to the surface.

C. Batch Reactor Results

Figure 4:
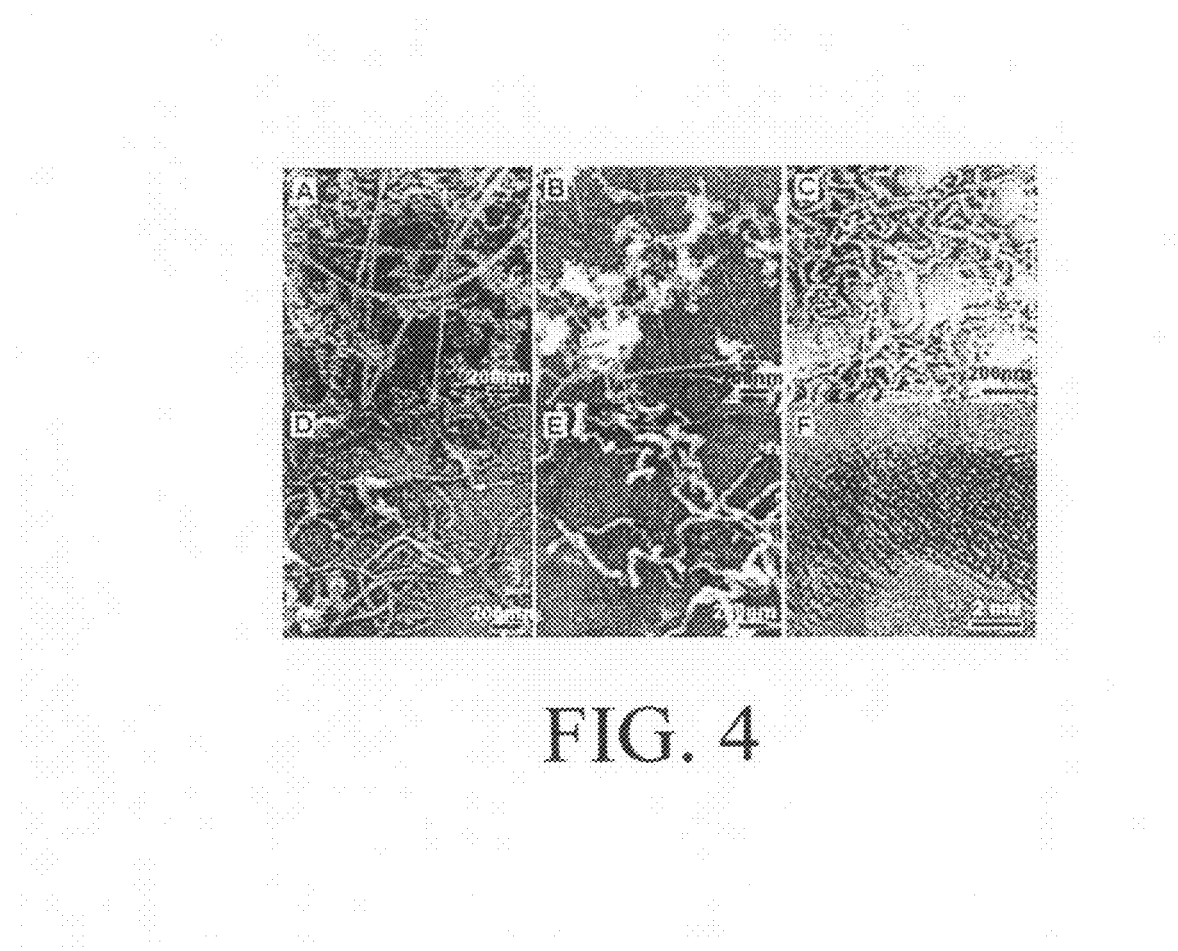
FIG. 4A-F provides images of nanowires grown from nanocrystals on a substrate in a batch reactor.

Although Si nanowires could be grown from the substrate under batch conditions, the nanowire quality was generally poor. FIG. 4 shows HRSEM images of the Si nanowires grown in a batch reactor from Si substrates with 2% Au nanocrystal surface coverage. At 500° C. and [DPS]=0.9 M, straight Si wires several micrometers in length were used observed (FIG. 4A). However, the wires were heavily surrounded by Si particles (see reference 26). Lowering the DPS concentration reduced Si particle formation considerably ([DPS]=0.25 M; FIG. 4B); however, under these conditions, most of the wires were shorter than 1 micron. Further reduction in DPS concentration ([DPS]=0.1 M) decreased particulate formation even more, but under these growth conditions, the wires exhibit a tortuous morphology due to defects in the crystal lattice (FIGS. 4C and 4F). Reduced temperature continued to decrease Si particle formation (FIGS. 4D and 4E, [DPS]=0.25 M at 450 C and 400 C, respectively), but at the expense of exceedingly tortuous nanowire production.

D. Flow Reactor Results

Figure 5:
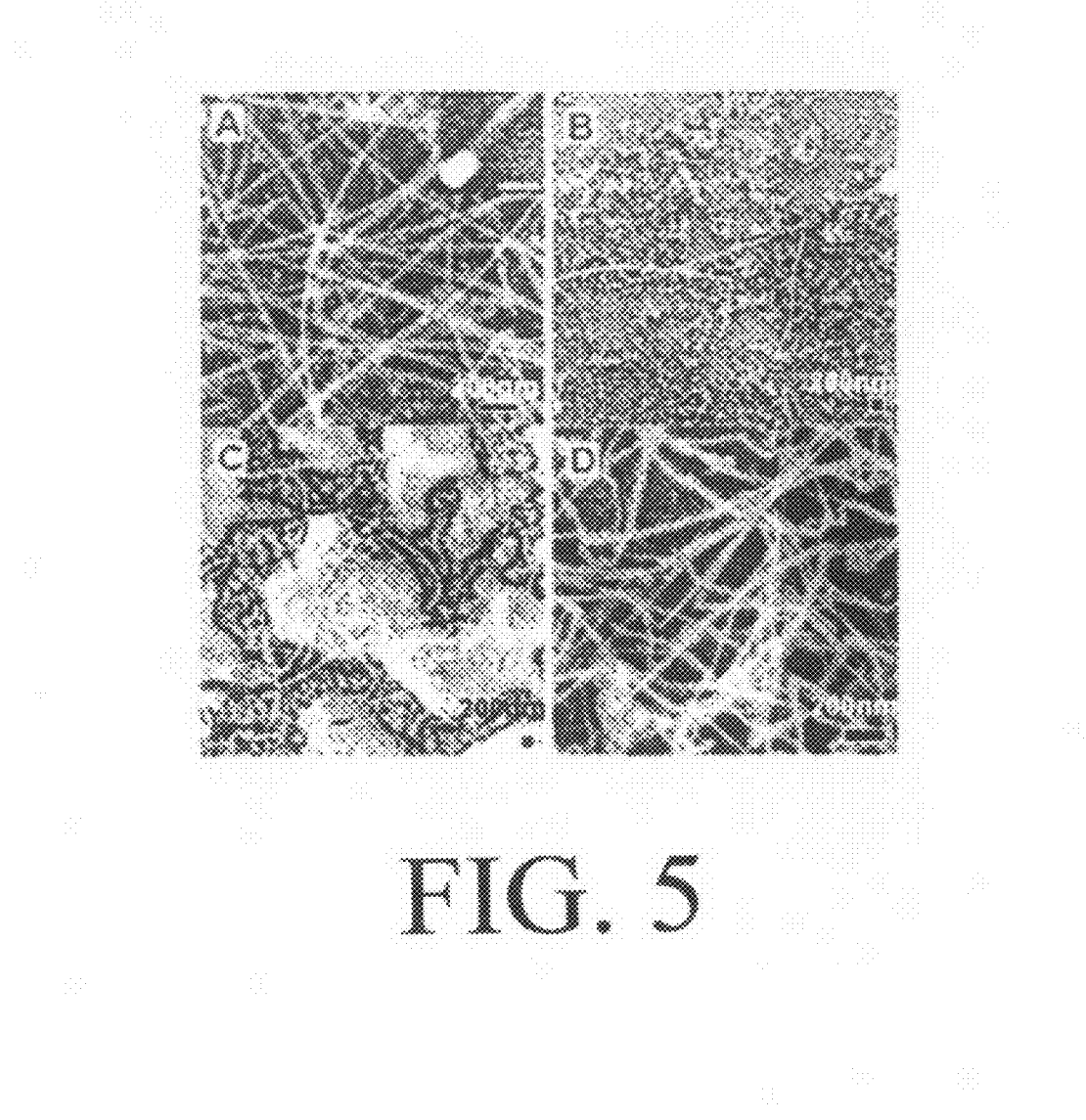
FIG. 5A-D provides images of nanowires synthesized in a flow reactor.

A flow reactor provided the way to produce straight nanowires with minimal Si particulate formation, because it provides (1) fluid-phase reactant concentrations that vary less significantly with time and (2) ways to flush the Si particulates formed in the fluid phase before depositing on the substrate. Si Nanowires produced at 500° C., [DPS]=0.25 M, and a feed rate of 0.5 mL/min were straight and contaminated with very few Si particles (FIG. 5A). The inset in FIG. 5A shows a gold particle at the end of a nanowire, indicating that the Au seeds participate directly in wire growth. The average Si wire diameter measured by HRSEM, 16±4 nm, resembles closely the Au particle size and size distribution prior to wire growth.

Au particles imaged by TEM appeared to be significantly smaller than when imaged by HRSEM due to the difference in resolution limits of the two instruments. By TEM, the diameter is 6.7±2.6 nm, whereas HRSEM shows that the nanocrystal diameter is 13.0±4 nm. The nanowire diameters determined by TEM match more precisely the nanocrystal diameter determined by TEM, while the nanowire diameter determined by HRSEM matches the nanocrystal diameters measured by HRSEM.

Nanowires as short as 5 nm and longer than 10 microns were present in the sample. Si particle formation increases at higher reactant flow rates. At 1.0 mL/min, particle formation became significant (FIG. 5B) and, at substantially higher flow rates (3 mL/min), nearly all the substrate ended up covered by Si particles (FIG. 5C). As in the batch reactor, reduced temperature resulted in bent and/or curly wires. For example, FIG. 5D shows curly wires formed at 0.5 mL/min at 450 C. Comparing the observed Si nanowire morphology resulting from different reaction conditions, it was found that high temperature and low flow rates produced straight wires with minimal particle formation.

Figure 6:
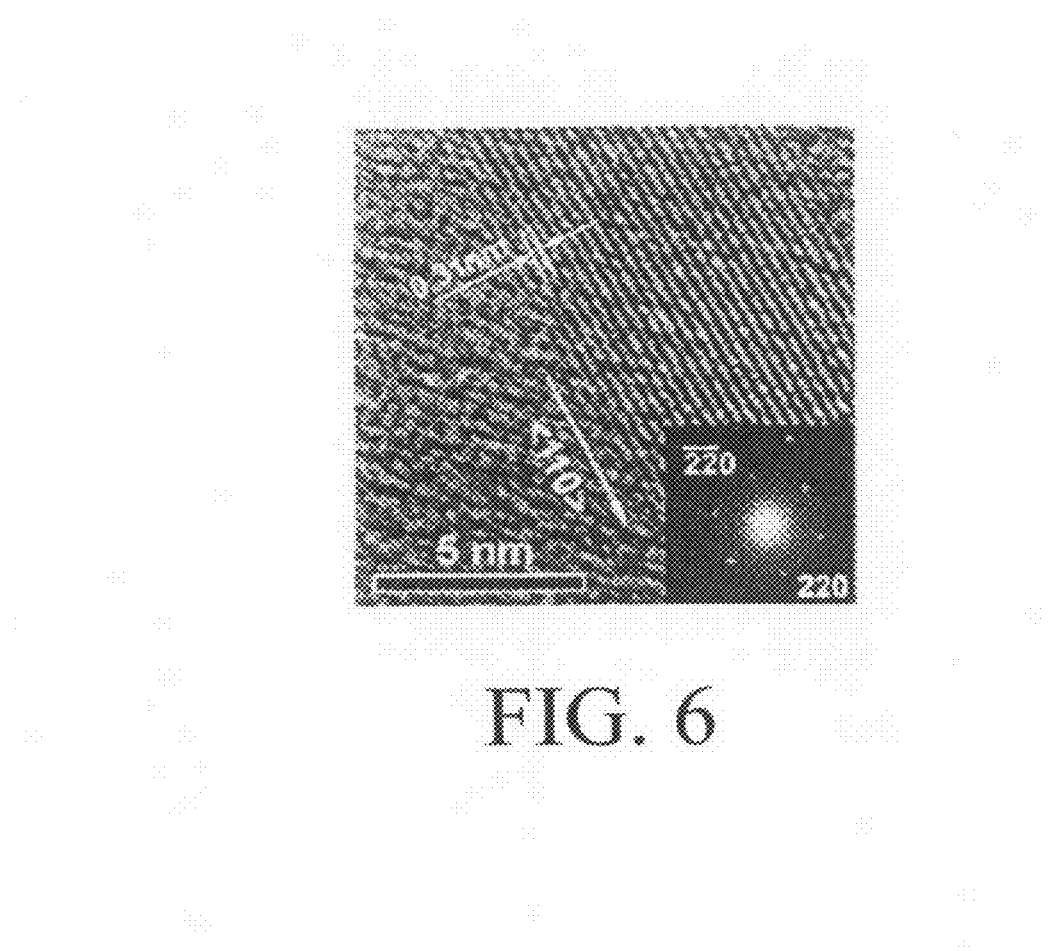
FIG. 6 provides HRTEM image of nanowires produced in the flow reactor.

HRTEM reveals the straight Si nanowires to be single crystals. FIG. 6 shows a representative image of a 7.2 nm diameter wire with the atomic planes spaced by 0.31 nm corresponding to the (111) d-spacing of diamond cubic silicon. The single-crystal electron diffraction pattern recorded perpendicularly to the long axis of the nanowires (FIG. 6 inset) and the lattice resolved TEM images of the crystalline Si corresponds to a <110> nanowire growth direction.

Example 2

Surface Derivatization of Ge Nanowires

Figure 7:
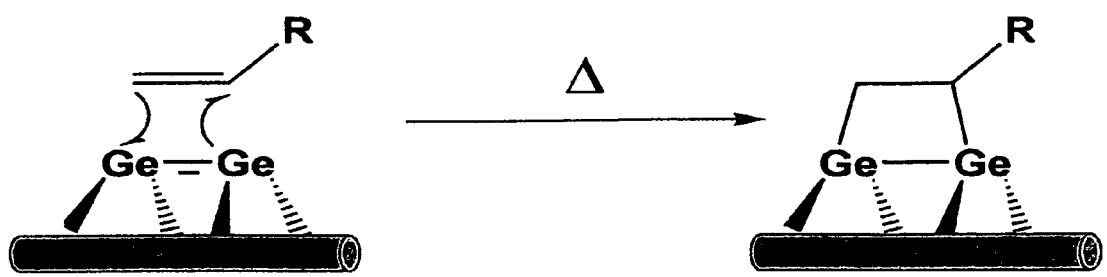
FIG. 7 provides an illustration of the surface derivatization of Ge nanowires by thermally initiated hydrogermylation according to Example 2. Heating the nanowires in the presence of 1-alkene forms an alkyl terminated Ge nanowire surface.
Figure 8:
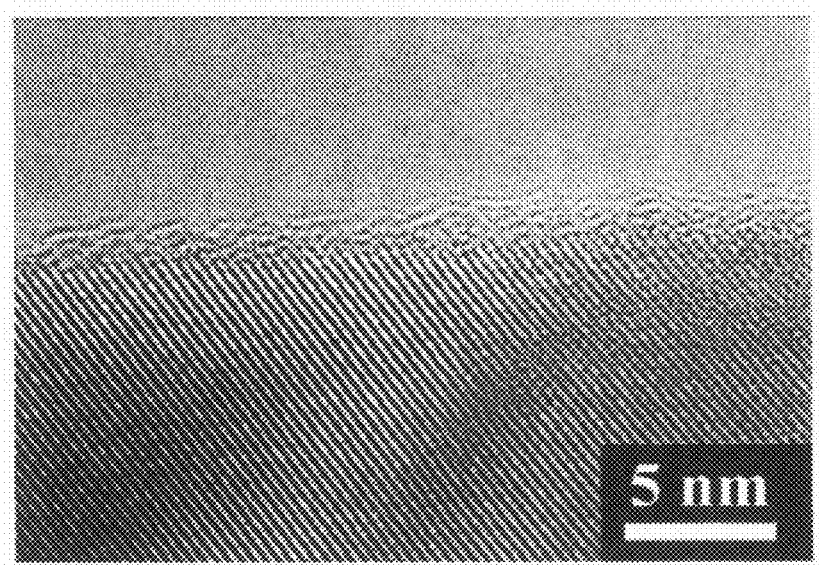
FIG. 8 provides an HRTEM image of a clean Ge nanowire surface after treatment with 1-hexadecene according to example 2. EDS analysis in the TEM showed no increase in oxygen content during the course of 1 week.
Figure 9:
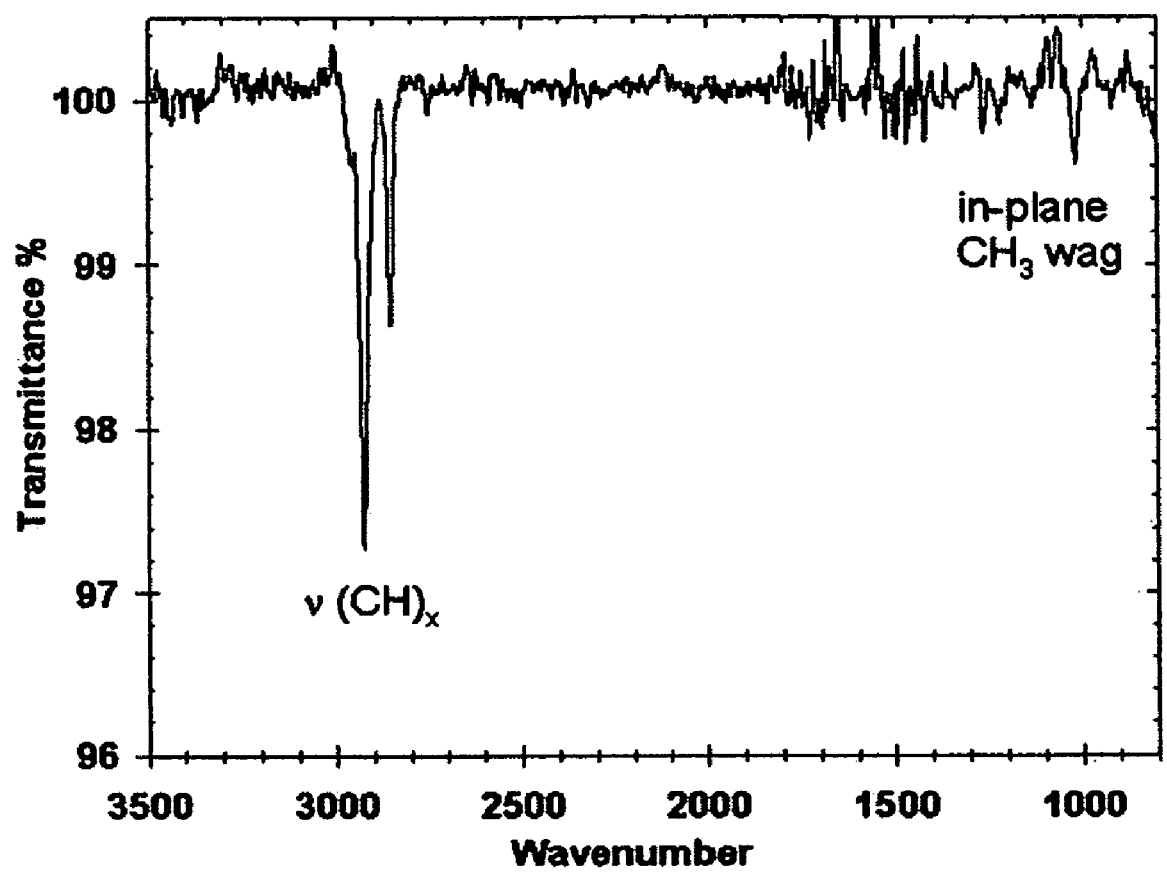
FIG. 9 provides an FT-IR spectrum of the Ge nanowire sample after derivatization according to example 2. The Ge nanowire pictured in FIG. 8 comes from this same sample.

A Cl-terminated Ge nanowire sample was prepared. For background, see, for example, Lu, Z. H., "Air-stable Cl-terminated Ge(111)" *Appl. Phys. Lett.*, 1996. 68(4): p. 520. Briefly, the oxide on the Ge nanowires surface was removed with an HF etch (2%, 4 min) followed by a treatment in diluted HCl (10%, 10 min). The nanowire sample was dispersed in ethanol and transferred to a new Si substrate for subsequent XPS analysis. A sulfide surface passivation was carried out. See, for example, Lyman et al., "Structure of a passivated Ge surface prepared from aqueous solution," *Surface Science*, 2000. 462: p. L594., wherein a HF etched nanowire sample was treated in an aqueous (NH$_4$)$_2$S solution at 80° C. for 20 minutes followed by several rinses in ethanol. Nanowire surface hydrogermylation was performed. For background, see Choi, K. and J. M. Buriak, "Hydrogermylation of alkenes and alkynes on hydride terminated Ge(100) surfaces," *Langmuir*, 2000. 16: p. 7737. FIG. 7 illustrates a representation of the surface chemistry occurring in this method. Briefly, the produced Ge nanowires were ejected from the reactor cell into a heated solution of 1-octene under an inert Ar environment. The solution was then refluxed at 70-80° C. for 2 h. Hydrogermylation experiments have also been carried out in-situ by injecting 1-hexadecene into the Ti reactor cell containing the produced nanowires. The reactor cell was maintained at 210° C. for 2 h after which excess alkene was flushed out of the reactor and the treated nanowires were transferred to an inert $N_2$ environment for storage. The derivatized Ge nanowires do not show any signs of oxidation in energy dispersive X-ray spectroscopy (EDS) or HRTEM (FIG. 8). Derivatization of Ge nanowires was confirmed by FTIR spectroscopy (FIG. 9). The peaks at 2875 and 2910 wavenumbers are due to C—H bond stretching and confirm the presence of alkyl groups on the Ge nanowires. The absence of a peak at 3090 wavenumbers confirms that there are no C=C double bonds in the sample, providing evidence to support the hydrogermylation mechanism depicted in FIG. 7.

Example 3

Continuous Production—Metal Nanocrystals Not Tethered to Substrate

Example 3 is similar to Example 1 described above. However, in Example 1, the Au nanocrystals were tethered to a Si substrate. In this example, Au nanocrystals directing nanowire growth were dispersed freely in solution.

The flow reactor was a 2 mL (0.5 cm i.d., 2.0 cm o.d., and 12.5 cm long) high-pressure titanium grade-2 cell with both ends connected to 1/16 in. o.d. and 0.03 in, i.d. stainless steel high-pressure tubing via titanium grade-2 LM-6 HIP reducers (High Pressure Equipment) (FIG. 2.) Two stainless steel cylinders (1.7 cm id., 2.5 cm o.d., and 20 cm long) were equipped with stainless steel pistons and ethylene propylene O-rings. In the glovebox, one of these cylinders was loaded with hexane and the other with 0.01 M diphenylgermane (DPG) and 0.00001 M Au nanocrystals in hexane stock solution. The cylinders were removed from the glovebox and connected to the preheater tubing. The reaction cell was then removed from the glovebox and connected via a three-way valve to the preheater tubing. The preheater tubing and the reaction cell were covered with heating tape and glass wool insulation and heated to 300° C. and 500° C., respectively. The temperature was measured by thermocouples under the heating tape and controlled to within about 5° C. in the preheater and 1° C. in the reactor. The cylinder containing pure hexane was pressurized by pumping D—$H_2O$ into the back of the piston using an HPLC (high pressure liquid chromatography) pump (Thermoquest) to inject oxygen-free hexane through the preheater tubing and into the reaction cell until reaching the desired pressure. The valves to the first cylinder containing only solvent were closed and the DPG/Au nanocrystal reaction solution valves were opened. The HPLC pump controlled the DPG/Au nanocrystal solution flow rates, which ranged from 0.5 to 3 mL/min. An SS-4R3A back-pressure regulator (Swagelok) connected after the reaction cell and a digital pressure gauge (Stratford) between the preheater tubing and the cell maintained the pressure at 24.1±1.4 MPa. The reaction proceeded for 30 min before switching the valves back to the solvent cylinder.

Example 4

Continuous Production with Simultaneous in situ Surface Passivation

Example 4 is similar to Example 3 as described above. However, in this example, the nanowires undergo in situ surface passivation by adding a surface passivating agent to the solution containing the Ge precursor and the metal nanocrystals. In this example, 1-hexene was chosen as the surface-passivating agent.

A. Experimental

The flow reactor was a 2 mL (0.5 cm i.d., 2.0 cm o.d., and 12.5 cm long) high-pressure titanium grade-2 cell with both ends connected to 1/16 in. o.d. and 0.03 in, i.d. stainless steel high-pressure tubing via titanium grade-2 LM-6 HIP reducers (High Pressure Equipment) (FIG. 2.) Two stainless steel cylinders (1.7 cm id., 2.5 cm o.d., and 20 cm long) were equipped with stainless steel pistons and ethylene propylene O-rings. In the glovebox, one of these cylinders was loaded with hexane and the other with 0.01 M diphenylgermane (DPG) and 0.00001 M Au nanocrystals in a solvent consisting of 90% hexane and 10% 1-hexene. The cylinders were removed from the glovebox and connected to the preheater tubing. The reaction cell was then removed from the glovebox and connected via a three-way valve to the preheater tubing. The preheater tubing and the reaction cell were covered with heating tape and glass wool insulation and heated to 300° C. and 400° C., respectively. The temperature was measured by thermocouples under the heating tape and controlled to within about 5° C. in the preheater and 1° C. in the reactor. The cylinder containing pure hexane was pressurized by pumping D—H2O into the back of the piston using an HPLC (high pressure liquid chromatography) pump (Thermoquest) to inject oxygen-free hexane through the preheater tubing and into the reaction cell until reaching the desired pressure. The valves to the first cylinder containing only solvent were closed and the DPG/Au nanocrystal reaction solution valves were opened. The HPLC pump controlled the DPG/Au nanocrystal solution flow rates, which ranged from 0.5 to 3 mL/min. An SS-4R3A back-pressure regulator (Swagelok) connected after the reaction cell and a digital pressure gauge (Stratford) between the preheater tubing and the cell maintained the pressure at 24.1±1.4 MPa. The reaction proceeded for 30 min before switching the valves back to the solvent cylinder.

B. Results

FIG. 12A-B shows HRTEM images of Ge nanowires produced in this example using continuous flow synthesis with simultaneous in situ surface passivation.

Figure 10:
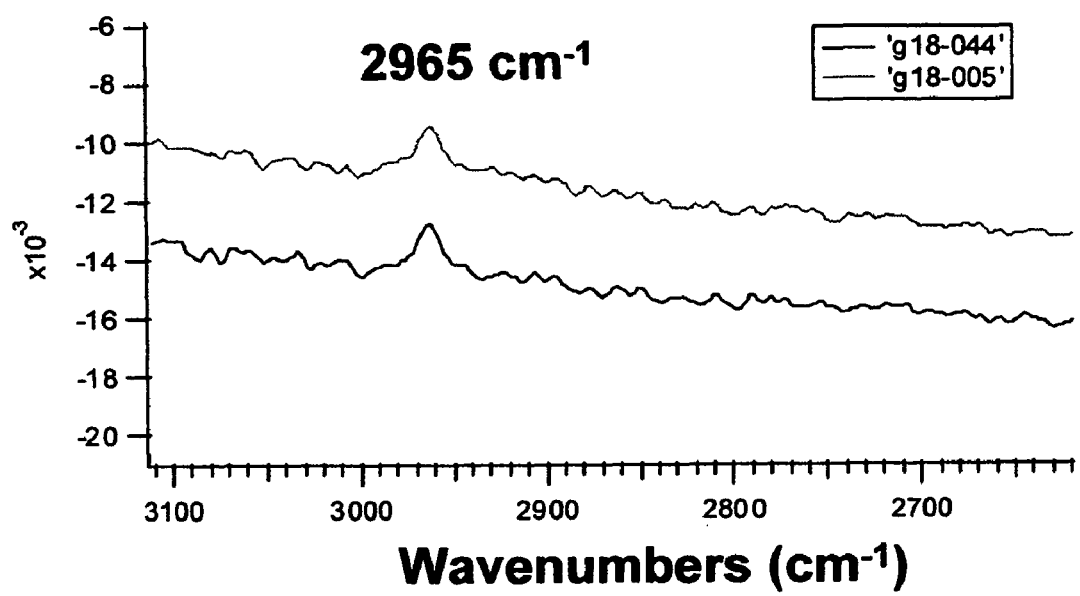
FIG. 10 provides an FT-IR spectra of Ge nanowires produced by continuous flow synthesis with simultaneous in situ surface passivation using 1-hexene according to example 4. The peak at 2965 wavenumbers due to C—H bonds indicates surface passivation with hexyl groups.

In FIG. 10, FT-IR spectra indicated successful surface passivation with hexyl groups. The bottom line of FIG. 10 shows the unpurified Ge nanowires according the present example, and the top line shows the same nanowires after washing multiple times with chloroform and ethanol. The peak at 2965 wavenumbers is due to C—H bonds, indicating successful surface passivation. The same peak present both before and after washing indicates the surface passivation is stable and not removed by routine handling or washing.

Figure 11:
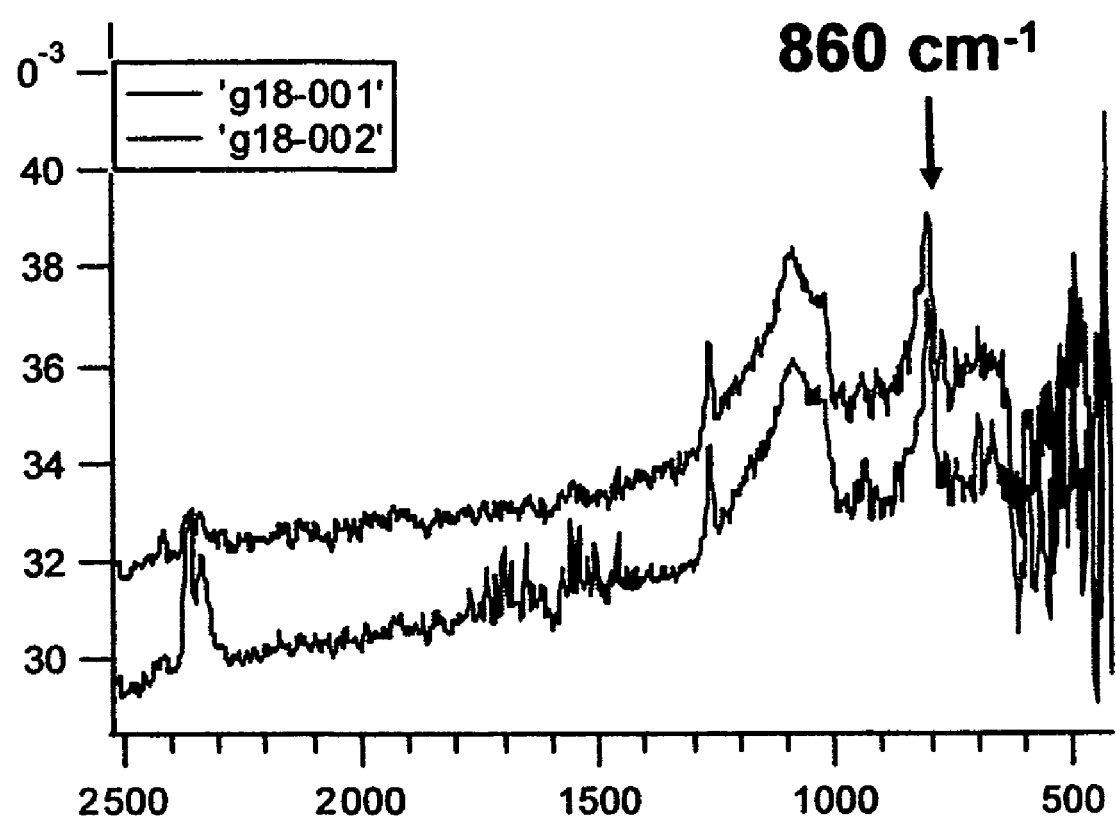
FIG. 11 provides an FT-IR spectrum of Ge nanowires produced by continuous flow synthesis with simultaneous in situ surface passivation using 1-hexene according to example 4. The peak at 860 wavenumbers is due to Ge—O bonds and indicates some surface oxidation.
Figure 12:
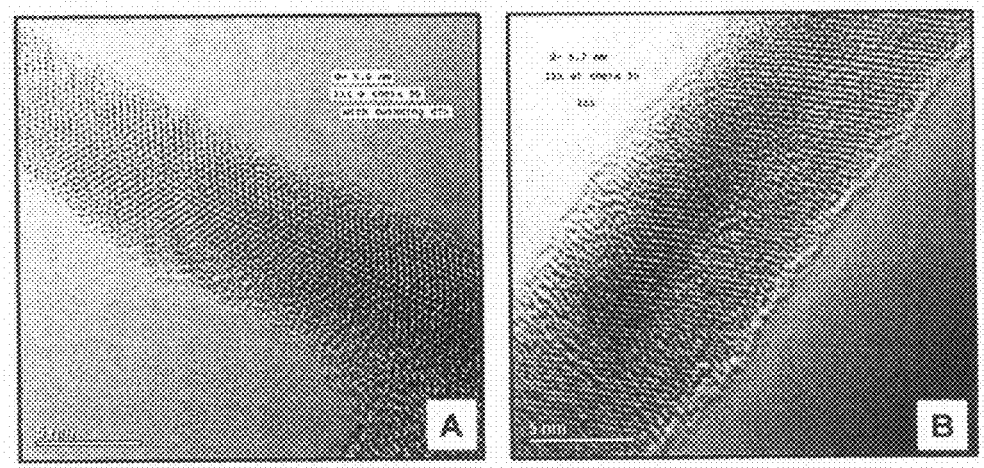
FIG. 12 provides HRTEM images of Ge nanowires produced using continuous flow synthesis with simultaneous in situ surface passivation according to example 4.

In FIG. 11, the Ge nanowires produced according to the present example showed some surface oxidation. FIG. 11 shows FT-IR spectrum from the same Ge nanowires both before (bottom line) and after (top line) washing. Both lines of FIG. 12 show a peak at 860 wavenumbers due to Ge—O bonds indicating some surface oxidation, possibly due to incomplete surface passivation. The peak at 860 wavenumbers is unchanged after washing the Ge nanowires multiple times with chloroform and ethanol indicating that routine handling and washing does not change the extent of oxidation.

Figure 13:
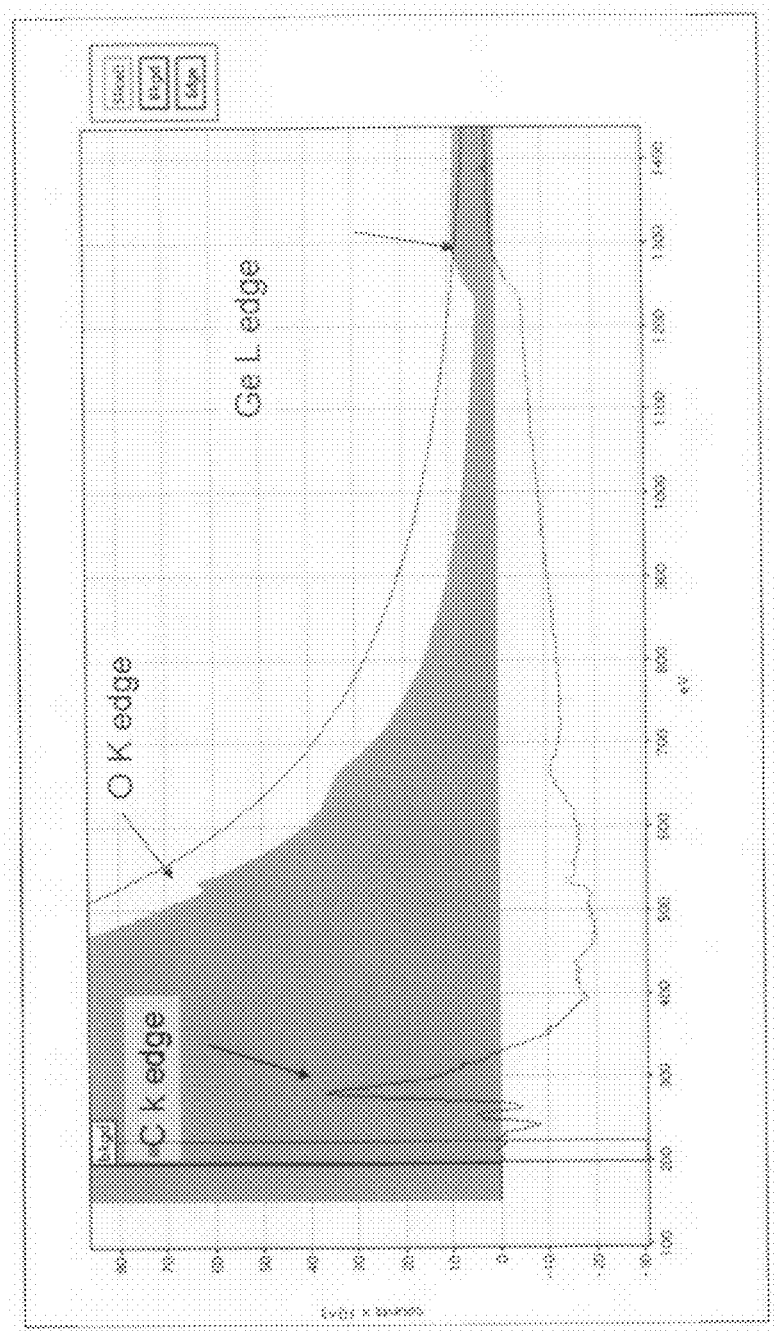
FIG. 13 provides an electron energy loss spectrum (EELS) of the Ge nanowire produced using continuous flow synthesis with simultaneous in situ surface passivation according to example 4.

In FIG. 13, electron energy loss spectrum results (EELS) confirmed the results obtained using FT-IR. FIG. 13 shows a large carbon signal (280 eV) indicating surface passivation with alkyl groups, a small oxygen signal (530 eV) indicating some surface oxidation, and a germanium signal.

Example 5

Continuous Production with in situ Metal Nanocrystal Formation

Example 5 is similar to Example 3 described above. In Example 3, the reagent solution contained already-made metal nanocrystals to direct nanowire growth. In Example 5, organometallic precursors, trioctylaluminum, reacted in situ to form the metal nanocrystals that subsequently directed the growth of the semiconductor nanowires.

The flow reactor was a 2 mL (0.5 cm i.d., 2.0 cm o.d., and 12.5 cm long) high-pressure titanium grade-2 cell with both ends connected to 1/16 in. o.d. and 0.03 in, i.d. stainless steel high-pressure tubing via titanium grade-2 LM-6 HIP reducers (High Pressure Equipment) (FIG. 2.) Two stainless steel cylinders (1.7 cm id., 2.5 cm o.d., and 20 cm long) were equipped with stainless steel pistons and ethylene propylene O-rings. In the glovebox, one of these cylinders was loaded with hexane and the other with 0.01 M diphenylgermane (DPG) and 0.00001 M trioctylaluminum in hexane stock solution. The cylinders were removed from the glovebox and connected to the preheater tubing. The reaction cell was then removed from the glovebox and connected via a three-way valve to the preheater tubing. The preheater tubing and the reaction cell were covered with heating tape and glass wool insulation and heated to 300° C. and 500° C., respectively. The temperature was measured by thermocouples under the heating tape and controlled to within about 5° C. in the preheater and 1° C. in the reactor. The cylinder containing pure hexane was pressurized by pumping D—H2O into the back of the piston using an HPLC (high pressure liquid chromatography) pump (Thermoquest) to inject oxygen-free hexane through the preheater tubing and into the reaction cell until reaching the desired pressure. The valves to the first cylinder containing only solvent were closed and the DPG/trioctylaluminum reaction solution valves were opened. The HPLC pump controlled the DPG/trioctylaluminum solution flow rates, which ranged from 0.5 to 3 mL/min. An SS4R3A back-pressure regulator (Swagelok) connected after the reaction cell and a digital pressure gauge (Stratford) between the preheater tubing and the cell maintained the pressure at 24.1±1.4 MPa. The reaction proceeded for 30 min before switching the valves back to the solvent cylinder.

The following references can be used as a guide to facilitate practice of the present invention. By citing these references, the inventors do not admit that any of these references are prior art.

REFERENCES (1) Holmes, J. D.; Johnston, K. P.; Doty, R. C.; Korgel, B. A. *Science* 2000, 287, 1471.
(2) Morales, A. M.; Lieber, C. M. *Science* 1998, 279, 208.
(3) Cui, Y.; Lieber, C. M. *Science* 2001, 291, 851.
(4) Cui, Y.; Lauhon, L. J.; Gudiksen, M. S.; Wang, J.; Lieber, C. M. *Appl. Phys. Lett.* 2001, 78, 2214.
(5) Hanrath, T.; Korgel, B. A. *J. Am. Chem. Soc.* 2002, 124, 1424.
(6) Coleman, N. R.; Morris, M. A.; Spalding, T. R.; Holmes, J. D. *J. Am. Chem. Soc.* 2001, 123, 187.
(7) Duan, X.; Lieber, C. M. *Adv. Mater.* 2000, 10, 298.
(8) Derycke, V.; Martel, R.; Appenzeller, J. *Nano Lett.* 2001, 1, 453.
(9) Odom, T. W.; Huang, J.-L.; Kim, P.; Lieber, C. M. *Nature* 1998, 391, 62.
(10) Wagner, R. S.; Ellis, W. C.; Jackson, K. A.; Arnold, S. M. *J. Appl. Phys.* 1964, 35, 2993.
(11) Heath, J. R.; LeGoues, F. K. *Chem. Phys. Lett.* 1993, 208, 263.
(12) Hu, J.; Odom, T. W.; Lieber, C. M. *Acc. Chem. Res.* 1999, 32, 435.
(13) Wu, Y.; Yang, P. *Chem. Mater.* 2000, 12, 605.
(14) Zhang, Y. F.; Tang, Y. H.; Wang, N.; Lee, C. S.; Bello, I.; Lee, S. T. *Phys. Rev. B* 2000, 61, 4518.
(15) Omi, H.; Ogino, T. *Appl. Phys. Lett.* 1997, 71, 2163.
(16) Shi, W.; Zhang, Y.; Lee, C. S.; Lee, S. T. *Adv. Mater.* 2001, 13, 591.
(17) Trentler, T. J.; Hickman, K. M.; Goel, S. C.; Viano, A. M.; Gibbons, P. C.; Buhro, W. E. *Science* 1995, 270, 1979.
(18) Gudiksen, M. S.; Lieber, C. M. *J. Am. Chem. Soc.* 2000, 122, 8801.
(19) Blackburn, J. M.; Long, D. P.; Cabanas, A.; Watkins, J. J. *Science* 2001, 294, 141.
(20) Shah, P. S.; Holmes, J. D.; Johnston, K. P.; Korgel, B. A. *J. Phys. Chem. B* 2002, 106, 2545.
(21) Korgel, B. A.; Fitzmaurice, D. *Phys. Rev. Lett.* 1998, 80, 3531.
(22) Brust, M.; Walker, M.; Bethell, D.; Schiffrin, D. J.; Whyman, R. *J. Chem. Soc., Chem. Commun.* 1994, 801, 1994.
(23) Yaws, C. L. *Handbook of Thermodynamic Diagrams*; Gulf Publishing Company: Houston, Tex., 1996.
(24) Kluth, G. J.; Sung, M. M.; Maboudian, R. *Langmuir* 1997, 13, 3775.
(25) Coutant, R. W.; Levy, A. "A Kinetic Study of the Thermal Decomposition of Selected Cyclohexyl and Phenylsilanes"; Aerospace Research Laboratories, 1969.

What is claimed is:

1. Crystalline nanowires comprising a group IV metal, which are substantially straight and substantially free of group IV metal nanoparticles;
    wherein each of the nanowires further comprises a non-group IV metallic nanocrystal at one end of the nanowire.
2. The nanowires of claim 1, wherein the group IV metal is silicon.
3. The nanowires of claim 1, wherein the group IV metal is germanium.
4. The nanowires of claim 1, wherein the nanowires have an average straightness parameter of no more than 2.
5. The nanowires of claim 1, wherein the metallic nanocrystals are gold nanocrystals.
6. The nanowires of claim 1, wherein the metallic nanocrystals are aluminum nanocrystals.
7. The nanowires of claim 1, wherein the nanowires have an average diameter of about 5 nm to about 50 nm.
8. The nanowires of claim 1, wherein the nanowires have an average diameter of about 10 nm to about 20 nm.
9. The nanowires of claim 1, wherein the nanowires have an average length of at least one micron.
10. The nanowires of claim 1, wherein the nanowires have an average length of at least 5 microns.
11. The nanowires of claim 1, wherein the nanowires are single crystals based on HR TEM analysis.
12. The nanowires of claim 1, wherein the nanowires are single crystals of silicon.
13. The nanowires of claim 1, wherein the nanowires are single crystals of silicon, comprise metallic nanocrystals at their end, have an average diameter of about 5 nm to about 50 nm, and have an average length of at least one micron.

14. A device comprising the nanowires of claim 1.

15. A device comprising the nanowires of claim 14, wherein the device is a transistor.

16. A device comprising the nanowires of claim 14, wherein the device is a field effect transistor.

17. A device comprising the nanowires of claim 14, wherein the device is a sensor.

18. A device comprising the nanowires of claim 14, wherein the device is a laser.

19. A device comprising the nanowires of claim 14, wherein the device is a light emitting diode.

20. A device comprising the nanowires of claim 14, wherein the device is a non-volatile memory device.

21. The nanowires of claim 1, wherein the nanowires contain less than about 5 wt. % nanoparticles, based on the total mass of the nanowires and nanoparticles.

22. The nanowires of claim 1, wherein the nanowires contain less than about 1 wt. % nanoparticles, based on the total mass of the nanowires and nanoparticles.

23. The nanowires of claim 1, wherein the nanowires are disposed on a substrate comprising catalyst sites attached to the substrate surface.

24. The nanowires of claim 23, wherein the nanowires are attached to the catalyst sites.

25. The nanowires of claim 24, wherein the attachment is a covalent attachment.

26. The nanowires of claim 23, wherein the catalyst sites comprise nanoparticulates.

27. The nanowires of claim 23, wherein the catalyst sites comprise metallic nanocrystals.

28. The nanowires of claim 23, wherein the catalyst sites cover less than about 10% of the surface of the substrate.

* * * * *